United States Patent [19]

Aden

[11] Patent Number: 4,957,835
[45] Date of Patent: Sep. 18, 1990

[54] MASKED ELECTRON BEAM LITHOGRAPHY

[75] Inventor: Gary D. Aden, Redwood City, Calif.

[73] Assignee: Kevex Corporation, Foster City, Calif.

[21] Appl. No.: 49,839

[22] Filed: May 15, 1987

[51] Int. Cl.[5] ............................................. G03F 1/00
[52] U.S. Cl. ....................................... 430/5; 430/296; 430/942; 250/492.3
[58] Field of Search ............................ 430/5, 296, 942; 250/492.22

[56] References Cited

U.S. PATENT DOCUMENTS

| | | | |
|---|---|---|---|
| 3,544,790 | 12/1970 | Brown | 430/942 X |
| 3,971,860 | 7/1976 | Broers et al. | 427/43 |
| 4,061,814 | 12/1977 | Pelitycki | 428/196 |
| 4,543,266 | 9/1985 | Matsuo et al. | 427/38 |
| 4,862,490 | 8/1989 | Karnezos et al. | 378/161 |

FOREIGN PATENT DOCUMENTS 0082977 7/1983 European Pat. Off. ............ 430/942

*Primary Examiner*—Jose Dees
*Attorney, Agent, or Firm*—Cushman, Darby & Cushman

[57] ABSTRACT

In an electron beam lithography system, a layer of photoresist is exposed in vacuum by a collimated flood beam of electrons passing through an electron mask in nominal contact with the photoresist to define the exposed images. The electron mask includes a mask wafer apertured to define one or more frames supporting one or more panes of electron permeable membrane material having an average atomic number less than 14 and each supporting a patterned layer of electron absorbing material defining the mask patterns. Suitable electron permeable membrane materials include BN, BC, SiC, $Si_3N_4$ and $Al_4C_3$ of a thickness of 0.1 μm to 2 μm.

5 Claims, 1 Drawing Sheet

MASKED ELECTRON BEAM LITHOGRAPHY

BACKGROUND OF THE INVENTION

The present invention relates in general to electron beam lithography and, more particularly, to such lithography employing a mask for patterning the electron beam passing therethrough to expose a photoresist to the mask pattern.

DESCRIPTION OF THE PRIOR ART

Heretofore, direct write electron beam lithography has been employed to achieve submicron line width resolution. Such systems focus an electron beam to a small spot on a layer of photoresist borne by a wafer. The electron beam intensity is modulated as the beam spot is scanned over the surface of the photoresist being exposed in vacuum to derive the exposed image. Such systems are disclosed in an article appearing in the February 1987 issue of Semiconductor International, pages 48–55.

One of the problems with direct write electron beam lithography is that the wafer throughput rate is relatively low at 2–20 wafers per hour on 100 mm diameter wafers with 0.5 $\mu$m features. Also, the direct write electron beam systems are relatively expensive due to the expensive electron beam optics.

It is also known to provide masked ion beam lithography for submicron line widths. In such systems, a layer of photoresist on a wafer in a vacuum is irradiated with a collimated beam of ions passing through a mask. The mask is made of a thin silicon membrane with the ion absorber patterns defined by regions of thicker silicon. This mask structure is reported to have less thermal distortion by comparison with earlier gold-on-silicon masks.

Such prior art masked ion beam lithography systems promise increased wafer throughput in comparison with direct write electron beam lithography but are relatively expensive due to the relatively costly ion beam source.

It is also known from the prior art to provide electron permeable vacuum-tight windows for use in thermal ink jet printers which use an electron beam as the source of thermal energy. Such windows use low average atomic number (Z) materials and are disclosed in U.S. Pat. No. 4,494,036 issued 15 Jan. 1985 and U.S. Pat. No. 4,468,282 issued 28 Aug. 1984.

While such electron windows, 1–5 $\mu$m thick, provide electron penetration at beam voltages of 15 to 30 kV, there is no recognition, in the prior art, that they would provide suitable masks for masked electron beam submicron lithography. It would not have been obvious beforehand that excessive electron beam scattering through the window would not have been encountered for submicron resolution.

It is desired to provide a system for masked electron beam lithography capable of delivering submicron resolution with increased wafer throughput and less cost in comparison with direct write electron beam systems.

SUMMARY OF THE PRESENT INVENTION

The principal object of the present invention is the provision of a system for masked electron beam lithography of high resolution.

In one feature of the present invention, a layer of photoresist is exposed by a pattern of electrons passing through an electron mask comprising a patterned layer of electron absorber material carried upon an electron permeable membrane.

In another feature of the present invention, the electron permeable membrane of the mask is made of a material having an average atomic number less than 14, whereby improved electron permeability is obtained with reduced electron scattering.

In another feature of the present invention, the electron permeable membrane is made of a material selected from the group consisting of boron nitride, boron carbide, silicon nitride, silicon carbide, and aluminum carbide.

In another feature of the present invention, the electron permeable membrane has a thickness falling within the range of 0.1 to 2.0 $\mu$m.

In another feature of the present invention, the electron absorber material is selected from the group consisting of nickel, gold, platinum, tungsten, zirconium, copper and palladium.

In another feature of the present invention, the electron being masked by the electron mask are collimated and have energies falling within the range of 2,000 to 40,000 volts.

In another feature of the present invention, the electron absorber material has a thickness overlaying the electron permeable membrane falling within the range of 500 Å to 15,000 Å.

In another feature of the present invention, the electron permeable membrane portion of the mask is supported by a frame portion of a wafer of diamond cubic crystalline material with the membrane lying generally in the plane of the (100) or (110) face of the crystalline material and with side walls of the frame defined by (111) planes.

In another feature of the present invention, the electron permeable membrane portion of the mask is supported by a frame portion of a wafer with the frame being elongated in the plane of a major face of the wafer.

Other features and advantages of the present invention will become apparent upon a perusal of the following specification taken in connection with the accompanying drawings wherein:

DESCRIPTION OF THE PREFERRED EMBODIMENTS

Figure 1:
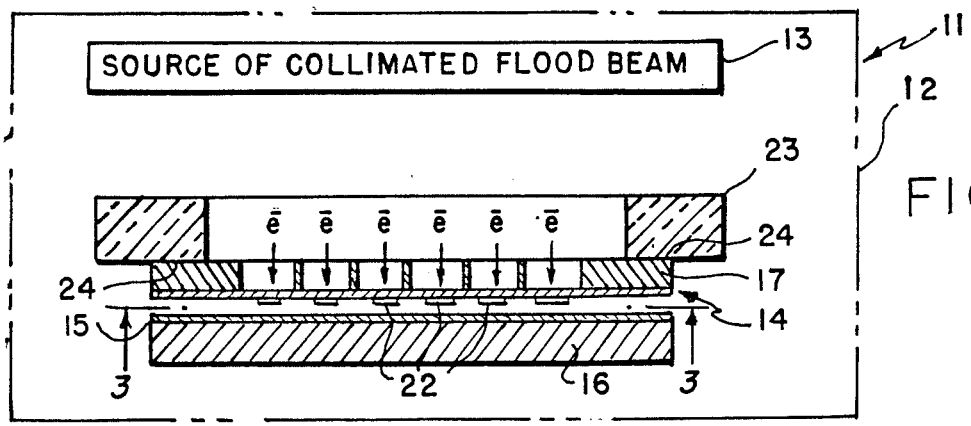
FIG. 1 is a schematic diagram, partly in block diagram form, of a masked electron beam lithography system incorporating features of the present invention.
Figure 2:
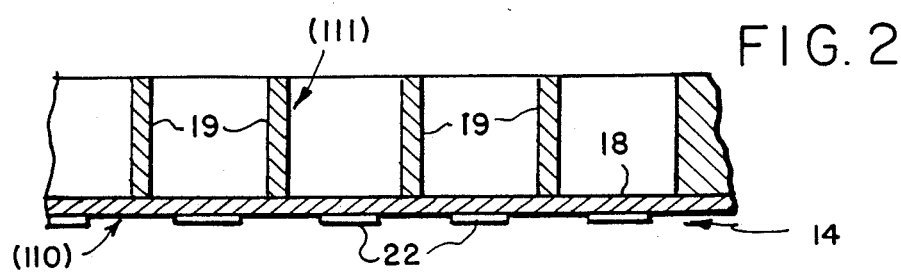
FIG. 2 is an enlarged sectional view of a mask portion of the structure of FIG. 1 delineated by line 2—2.
Figure 3:
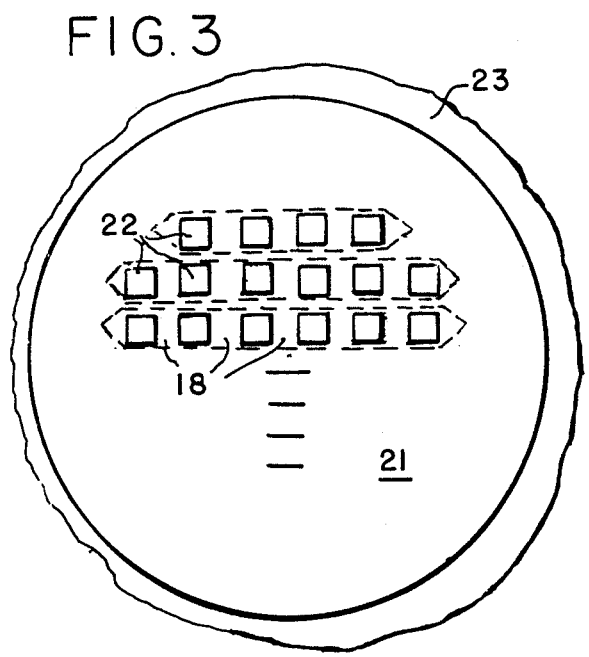
FIG. 3 is a plan view of a portion of the mask structure of FIG. 1 taken along line 3—3 in the direction of the arrows.

Referring now to FIGS. 1–3, there is shown a masked electron beam lithography system 11 incorporating features of the present invention. The system 11 includes an evacuated envelope 12 containing a source 13 of a flood beam of collimated electrons of an energy falling within the range of 2,000 to 40,000 volts.

The flood beam of electrons irradiates an electron contact mask 14, disposed in overlaying nominal contact, i.e., 0 to 5 μm spacing, with a film 15 of photoresist overlaying a major face of a wafer 16, as of 3" to 8" in diameter, to be masked. A suitable positive photoresist is poly(methylmethacrylate), also known as PMMA, having a sensitivity of 80 μ coul/cm$^2$ and a resolution of 0.05 μm.

The mask 14 includes a mask wafer 17 preferably of a single crystal diamond cubic material such as silicon of larger diameter than that of the wafer 16 being photomasked. The mask wafer 17 is anisotropically etched through substantially its entire thickness to define a plurality of electron permeable panes 18, each supported by a surrounding frame portion 19 of the wafer 17. The electron permeable panes 18 are defined by an electron permeable membrane layer 21 grown onto the major face of the mask wafer 17 and serving as an etch stopped layer for the anisotropic etchant such as KOH used to etch the silicon mask wafer 17.

Suitable electron permeable membrane layer materials are materials having an average atomic number (Z) less than 14. Included in such materials are boron nitride, boron carbide, silicon nitride, silicon carbide and aluminum carbide. Suitable thicknesses for the membrane layer 21 are within the range of 0.1 μm to 2.0 μm. Such materials are conveniently deposited upon the mask wafer 17 by chemical vapor deposition and are preferably deposited in tension.

A patterned layer 22 of an electron absorber material is deposited, as by evaporation or sputtering, upon the surface of the membrane 21 overlaying the respective panes 18. The patterned electron absorber layer 22 absorbs the collimated electrons incident thereon to pattern the electron stream which passes through the membrane layer 21 to the layer of photoresist 15, thereby exposing the photoresist to the electron absorber patterns or images. The exposed wafer 16 is then processed in the conventional manner to develop the images.

Suitable electron absorber materials are those having a relatively high atomic number Z such as gold, nickel, platinum, tungsten, zirconium, copper and palladium. A suitable thickness for the electron absorber layer falls within the range of 500 Å to 15,000 Å.

The mask wafer 17, as of 10 to 100 mils thick, is bonded to the major face of a centrally apertured base plate 23, as of Pyrex 7740 glass, preferably by an anodic (thermoelectric) bond at 24.

Conventional load locks and wafer handling mechanisms, not shown, are employed to successively expose wafers 16 within the vacuum envelope 12 of the masked electron beam lithography system 11.

The mask wafer 17 is conveniently processed to define the panes 18 and surrounding frames 19 by polishing both major faces of the wafer 17, as of (110) silicon, to a mirror finish and to a high degree of flatness with an absolute minimum of taper and bow. After cleaning and preparation, the membrane layer 21 is grown on the major faces of the wafer 17 to the desired thickness. The backside of the wafer 17 is then photomasked and opened to expose the silicon in the pattern of frame openings. With the frontside of the wafer 17 protected, the backside is anisotropically etched with a suitable etchant, such as a 5N solution of KOH at 82° C., to etch through the entire thickness of the wafer 17 to the etch stop layer formed by the membrane layer 21. The side walls of the frames 19 are defined by the (111) planes which etch at a much lower rate than the exposed (110) planes. The resultant long narrow panes 18 are elongated in the (110) plane of the wafer 17. The wafer 17 is then cleaned and the metal absorber layer deposited on the front face of the wafer 17 overlaying the panes 18. This layer is then patterned, as by conventional direct write electron beam lithography to define the mask pattern in the electron absorber layer 22. Thereafter, the mask wafer 17 is anodically bonded to the Pyrex plate 23.

Figure 4:
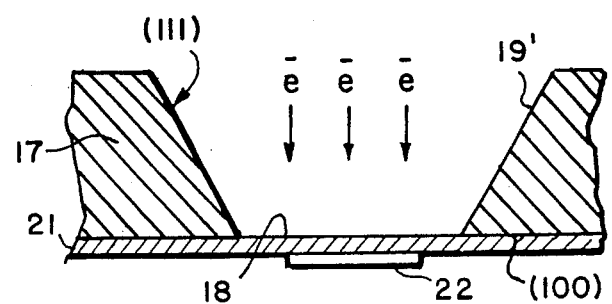
FIG. 4 is an enlarged view of a portion of the mask structure of FIG. 2 delineated by line 4—4 and depicting an alternative embodiment.

Referring now to FIG. 4, there is shown an alternative embodiment of the electron mask wafer 17, wherein the wafer 17 is a (100) silicon wafer. In this embodiment, the (111) planes do not intersect the (100) plane at normal incidence such that the side walls of the frames 19' are not normal to the major face of the wafer 17. Thus, the side walls 19' of the frames are substantially thicker than in the case of a (110) wafer 17. However, a step and repeat exposure through such a mask allows exposure of the entire wafer 16.

Figure 5:
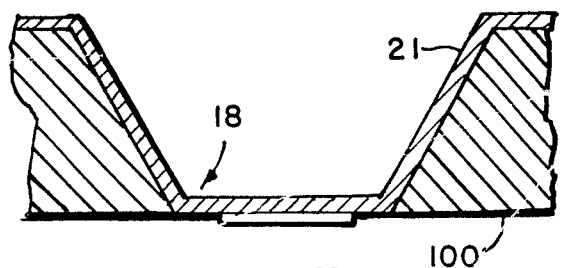
FIG. 5 is a view similar to that of FIG. 4 depicting an alternative embodiment of the present invention.

Referring now to FIG. 5, there is shown an alternative electron beam mask 14 of the present invention. In this embodiment, an etch stop layer is formed on the front face of the mask wafer 17. The backside is anisotropically etched through to expose the etch stopped layer. The layer 21 of electron permeable membrane material is then deposited through the backside of the wafer 17 into overlaying relation with the etch stopped layer. The etch stopped layer is then removed to expose the pane 18 of electron permeable material 21. Thereafter, the layer 22 of electron absorber material is deposited and patterned upon the frontside of the mask wafer 17. This alternative mask wafer fabrication technique is also applicable to (110)-type mask wafers 17.

A principal advantage of the present invention is the provision of increased throughput for a less costly wafer lithography system capable of submicron resolution.

What is claimed is:

1. In a method for making a mask for flood beam electron lithography wherein the flood beam is patterned by passing through the mask and thence into the photoresist for exposure thereof, the steps of:
    recessing a substrate from one side to define a recess having a frame portion closed by a bottom end wall portion of the substrate;
    forming a relatively thin membrane layer of electron permeable material overlaying the bottom end wall of the recess;
    removing the end wall material overlaying said relatively thin membrane layer of electron permeable material; and
    forming a patterned layer of electron absorber material overlaying said membrane layer of electron permeable material to define the electron mask.

2. The method of claim 1, wherein the electron permeable material is selected from the group consisting of boron nitride, boron carbide, silicon nitride, silicon carbide, and aluminum carbide.

3. The method of claim 1, wherein the membrane layer is formed of a thickness falling within the range of 0.1 to 2.0 micrometers.

4. The method of claim 1, wherein the electron absorber material is selected from the group consisting of nickel, gold, platinum, tungsten, zirconium, copper and palladium.

5. The method of claim 1, wherein the layer of electron absorber material is formed of a thickness falling within the range of 500 to 15,000 Å.

* * * * *